United States Patent [19]

Güning

[11] Patent Number: 4,929,856
[45] Date of Patent: May 29, 1990

[54] HEAVY-DUTY CIRCUIT BREAKER
[75] Inventor: Horst Güning, Baden, Switzerland
[73] Assignee: Asea Brown Boveri AG, Baden, Switzerland
[21] Appl. No.: 301,828
[22] Filed: Jan. 26, 1989
[30] Foreign Application Priority Data
  Jan. 26, 1988 [CH] Switzerland ............ 262/88-3
[51] Int. Cl.⁵ ............................................ H03K 17/72
[52] U.S. Cl. ......................... 307/633; 307/631; 307/305; 357/38
[58] Field of Search ............... 307/633, 305, 631; 357/38, 38 A

[56] References Cited
U.S. PATENT DOCUMENTS

| | | | |
|---|---|---|---|
| 4,354,121 | 10/1982 | Terasawa et al. | 307/633 |
| 4,542,398 | 9/1985 | Yatsuo et al. | 357/38 |
| 4,626,888 | 12/1986 | Nagano et al. | 357/38 |
| 4,710,792 | 12/1987 | Suzuki | 357/38 |
| 4,752,705 | 6/1988 | Tsuruta et al. | 307/633 |

FOREIGN PATENT DOCUMENTS

| | | |
|---|---|---|
| 0077930 | 5/1983 | European Pat. Off. . |
| 0228226 | 7/1987 | European Pat. Off. . |
| 0246478 | 11/1987 | European Pat. Off. . |
| 0283588 | 9/1988 | European Pat. Off. ........... 307/633 |
| 3134074 | 5/1982 | Fed. Rep. of Germany . |

OTHER PUBLICATIONS

Patent Abstracts of Japan, vol. 9, No. 288(E-358) (2011), Nov. 15, 1985.
Siemens Components, vol. 19, No. 6, Dec. 1984, (Berlin, DE) W. Goldbrunner, et al., "Capacitors for GTO Thyristors", pp. 264–268.
Siemens Components, vol. 25, (1987), "GTO-Thyristoren: Leistungsschalter fur heute und morgen", Martin Bechteler.

Primary Examiner—John Zazworsky
Attorney, Agent, or Firm—Oblon, Spivak, McClelland, Maier & Neustadt

[57] ABSTRACT

In a heavy-duty circuit breaker comprising a turn-off-type semiconductor component and a control unit (AS), the interfering inductance in the control circuit is considerably reduced by dividing the control unit (AS) into similar sub units (AS1, . . . , ASn) which operate in parallel.

8 Claims, 2 Drawing Sheets

HEAVY-DUTY CIRCUIT BREAKER

BACKGROUND OF THE INVENTION

1. FIELD OF THE INVENTION

The present invention relates to the field of power electronics. In particular, it relates to a heavy-duty circuit breaker comprising a semiconductor component which can be turned off via a gate; and a control unit which generates the gate current necessary for turn-off.

Such a heavy-duty circuit breaker is known, for example, from EP-A2 No. 0077930 (FIG. 3).

DISCUSSION OF BACKGROUND

In power electronics, components which can be turned off directly via a gate are becoming increasingly more important in addition to conventional thyristors which can only be taken into the off state after the current drops below a particular holding current.

Known types of these turn-off-type components are, for example, the GTO (Gate Turn Off thyristor), the FCTh (Field Controled Thyristor) and the SITh (Static Induction Thyristor).

During the turn-off phase, large gate currents are needed within a short time in these GTOs, FCThs, SIThs and similar bipolar heavy-duty components.

These gate currents must be taken from a source having a relatively low voltage so that the gate-cathode path of the component is not destroyed by an avalanche breakdown. For the control circuit, this results in the requirement for as low as possible an inductance with, at the same time, an extremely high pulse load carrying capacity.

Previous control concepts meet this requirement only to a slight extent: Although these concepts attempt a uniform distribution of the gate current over the semiconductor substrate, that is to say the component surface on the control side, by suitably designing the gate contact arrangement in the form of central or ring gates (see, for example German Offenlegungsschrift No. 31 34 074).

The type and configuration of the control unit necessary for the turn-off, however, are left out of consideration in these efforts. Thus, for example, the control unit with its current source and the associated circuit breaker are arranged as a compact unit far distant from the actual component.

The long feed lines necessary in this arrangement make a major contribution to the unwanted circuit inductance and thus limit the value of the achievable rate of current increase dI/dt (see, for example: Siemens Components 25 (1987), pages 24–26).

Thus, for example, in spite of an artificially enhanced turn-off current gain of $I_{TGQM}/I_{GQ}$ of greater than 4, a turn-off delay time $t_s$ is obtained in GTOs which is much greater than the drop time $t_f$. This leads to the formation of current filaments, because the GTO is triggered too slowly and, therefore, part areas can already be turned off whilst other ones are still completely flooded with charge carriers.

Due to the electric similarity, comparable mechanisms of filament formation also exist in the FCThs. Already existing FCThs of relatively low power (10 A) are therefore operated with a high gate current (turn-off gain of less than 1) and very high $dI_G/dt$ ($I_G$=gate current). Thus, the injection of electrons into all areas by the cathode is interrupted before the space charge zone between gate and anode can build up, and a filament formation is reliably prevented.

However, an application in large converters requires FCTs of much greater power (500 A–3000 A). The demands on the control arrangement increase correspondingly and the circuit inductance of the current control circuits must be reduced by about a factor of 50 to 300.

Such a reduction, however, cannot be achieved by means of simple cascade such as has been proposed in EP-A No. 0 246 478 because the inherent inductance of the best currently available capacitors (5 nH) is already clearly above the required value of less than 1 nH.

SUMMARY OF THE INVENTION

It is then the object of the present invention to create a heavy-duty circuit breaker in which the inductance of the control circuit limiting the current increase is drastically reduced by means of suitable measures on the control side.

In a heavy-duty circuit breaker of the type initially mentioned, the object is achieved by virtue of the fact that the control unit is divided into a plurality of sub units operating in parallel, which in each case generate a part of the gate current necessary for the turn-off.

The core of the invention consists in reducing the effect of the inherent inductances of the control components in the sub units by connecting several sub units in parallel.

According to a preferred embodiment of the invention, the turn-off-type semiconductor component exhibits a gate electrode which is arranged to be spatially distributed and which is connected to the individual sub units at various places.

As a result, the lines between control unit and gate electrode are also included in the parallel circuit and the inductance is further reduced.

In this connection, it is particularly advantageous to place the sub units as close as possible to the component itself, in particular to integrate them in the housing.

BRIEF DESCRIPTION OF THE DRAWING

In the text which follows, the invention will be explained in greater detail with reference to illustrative embodiments in connection with the drawing, in which.

DESCRIPTION OF THE PREFERRED EMBODIMENTS

The basic circuit of a heavy-duty circuit breaker comprising a gate turn-off thyristor 1 is shown in FIG.

1. The gate turn-off thyristor 1 is located with its anode A and its cathode K in a main circuit not drawn.

The gate G and the cathode K of the thyristor are connected to a control unit AS which usually contains means both for turning the thyristor on and for turning it off. Since the invention only deals with the problems occurring during turn-off, reference is made only to the turn-off circuit in this and all other Figures.

This turn-off circuit basically comprises a controllable switch 3 and a current source 4 which are connected in series. In addition, an inductance 2 must also be taken into consideration which includes the inherent inductance of the elements of the control unit and the inductance of the feed lines to the gate G.

Figure 3A:
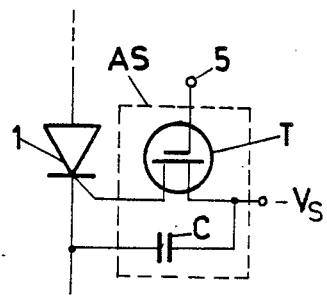
FIGS. 3A, B show two embodiments of a control unit according to the prior art.
Figure 3B:
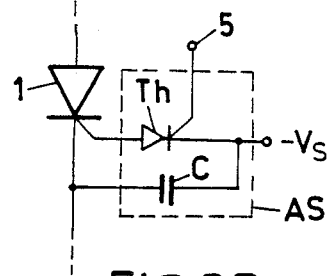

In a real control unit AS, the switch 3 can be implemented, for example, by means of a control transistor T of the MOSFET type (FIG. 3A) or by means of a control thyristor Th of the FCTh type (FIG. 3B). Other types of semiconductor switches such as GTOs or fast conventional thyristors are also conceivable.

As the current source 4, a capacitor C charged by a control voltage $V_S$ is preferably used (FIGS. 3A, B) since only a short-time gate current pulse is needed for the turn-off.

Figure 1:
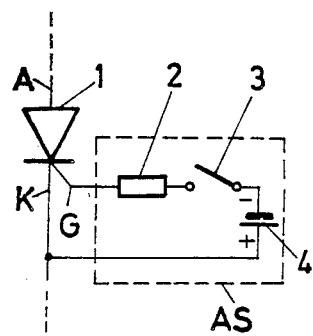
FIG. 1 shows the basic circuit diagram of a heavy-duty circuit breaker with gate turn-off thyristor according to the prior art.

Naturally, only the basic elements of the control unit are reproduced in FIGS. 1, 3A and 3B and a complete control circuit has a considerably more complex configuration (see, for example, EP-A No. 0 246 478).

As already mentioned, the inductance 2, which determines the achievable current increase $dI_G/dt$ in the gate circuit, comprises both the feed line inductances and the inherent inductance of the control unit AS of the heavy duty circuit breaker which is arranged outside the gate turn-off thyristor 1.

Figure 2:
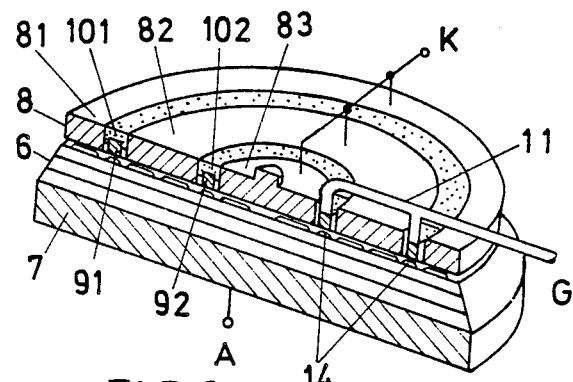
FIG. 2 shows an example of a GTO according to the prior art.

The origin of the feed line inductances can be explained on the example of a known GTO which is represented in FIG. 2.

This GTO, which is constructed to be rotationally symmetric in the example (but not necessarily so), contains a semiconductor substrate 6 with a sequence of layers of different doping which exhibits a step- or mesa-shaped gate-cathode structure on the cathode side.

For contacting purposes, the semiconductor substrate 6 is arranged between a metallic anode plate 7 and a metallic cathode plate 8.

In this case, the gate access takes place via annular gate electrodes 14 which extend between the individual rings of cathode and emitter fingers, in order to ensure a uniform distribution of the gate current over the entire substrate area.

The gate electrodes 14 are contacted by corresponding gate rings 91, 92 which are inserted into the cathode plate 8, electrically isolated by a suitable gate ring insulation 101, 102. The cathode plate 8 is thus composed of several individual plates 81, 82, 83.

From the gate rings 91, 92, a single gate feed line 11 leads to the outside through the case, not drawn, and is connected to the control unit (also not represented).

It can be easily seen that this type of gate connection unnecessarily increases the interfering inductance of the gate circuit even if, as proposed in the printed document Siemens Components 25 (1987), pages 24–26, initially quoted, the control unit is placed as close as possible to the case of the gate turn-off thyristor.

But a further significant source for the inductance in the gate circuit is the control unit itself; as already described initially, the inductance cannot drop below certain values with a semiconductor switch and a capacitor C in the unit.

The approach of the invention is then to divide the control unit AS into a plurality of similar sub units AS1, . . . , ASn operating in parallel (FIG. 4), in which arrangement each sub unit AS1, . . . , ASn is equipped with a correspondingly smaller semiconductor switch and a smaller capacitor C1, . . . , Cn and provides only a part of the required gate current.

Figure 4:
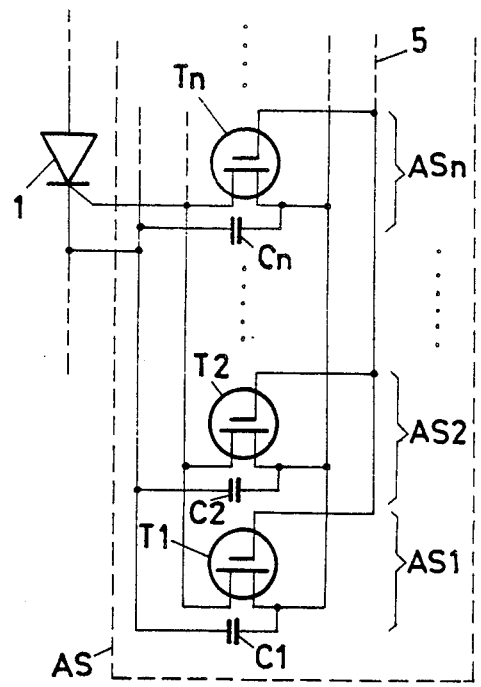
FIG. 4 shows a control unit according to a first illustrative embodiment of the invention.

In this arrangement, MOSFET control transistors T1, . . . , Tn are used as semiconductor switches in analogy to FIG. 3A in the illustrative embodiment of FIG. 4. However, in analogy to FIG. 3B, control thyristors can also be used in the same manner.

Figure 5:
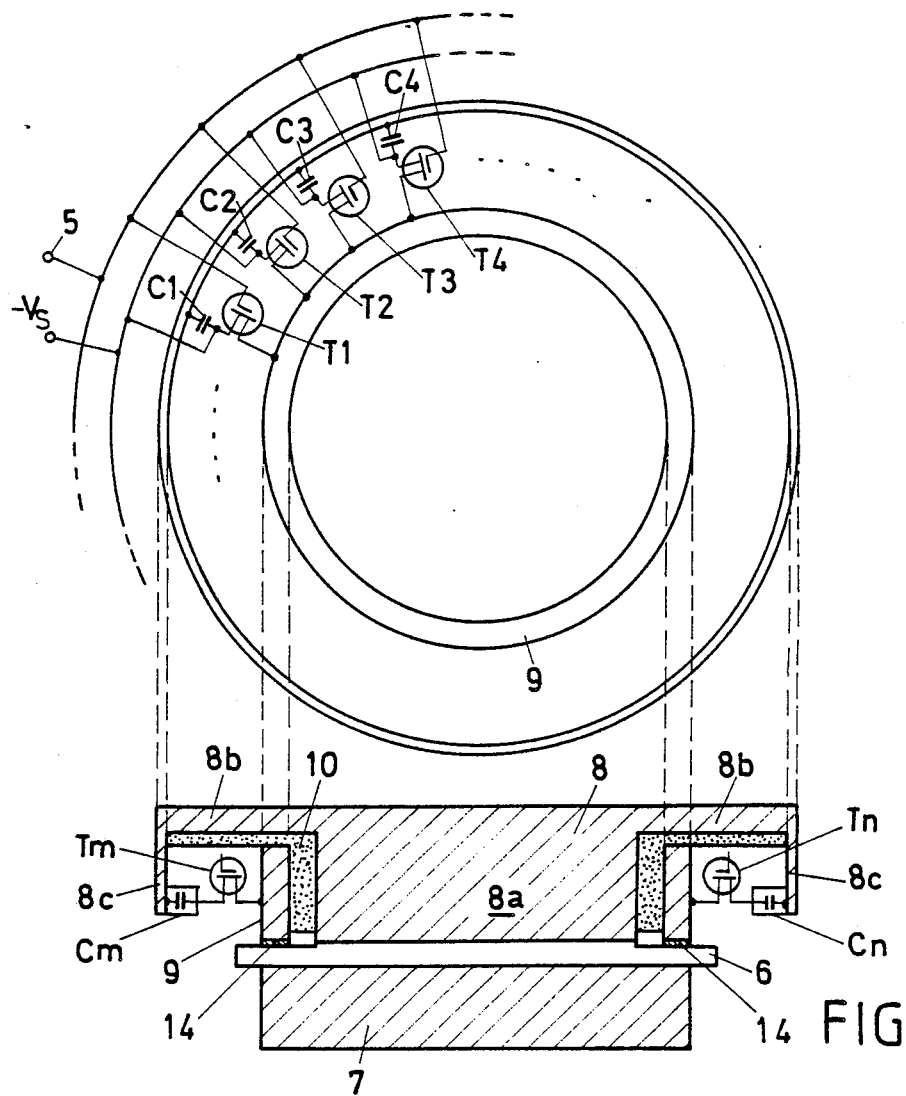
FIG. 5 shows a top view of and section through a heavy-duty circuit breaker according to a second illustrative embodiment of the invention.

By means of this parallel circuit due to the division into sub units, a significant reduction in the inductance can already be achieved on the control side. The conditions become even more favorable, however, if the sub units AS1, . . . , ASn are not connected to a common gate feed line according to FIG. 2 but are arranged, spatially distributed, directly inside the case of the gate turn-off semiconductor component and are connected to various places of the gate electrode or of the gate ring (FIG. 5.)

This combination of connecting several sub units in parallel and optimally arranging them around the component to be turned off minimizes the feed line inductances and reduces the effect of the inherent inductances of the control components.

At the same time, a much more homogeneous control of the circuit breaker is achieved because the current is fed to a ring gate, for example, simultaneously from all sides and with similar impedance. This provides an optimum simultaneous turn-off of all areas and, connected with this, the best prerequisites for a homogeneous turn-off of the entire heavy duty circuit breaker.

In this connection, it is in principle of no importance whether the turn-off semiconductor component is a GTO, a FCTh, a SITh or some other bipolar heavy-duty component having a high gate current requirement and dI/dt. Even large-area high-frequency FETs can be optimally controlled in this form.

In principle, it is also of no significance whether MOSFETs, thyristors, GTOs or FCThs are used as semiconductor switches. For controlling GTOs and, especially FCThs, however, preferred embodiments are naturally given:

In one such embodiment, FCThs are used for controlling in accordance with EP-A No. 0 246 478. The gates of these control components are connected to one another (in accordance with FIG. 4). Thus, when a control FCTh is switched on which is accidentally leading, its gate is positively charged by the holes accepted by the anode much more rapidly than the anode current can rise, and this potential reaches the gates of the other FCThs without delay via the connection. In consequence, all FCThs are then turned on and, because of the small signal current required, the delay between the individual FCThs is extremely short (a few ns) even though the inductance of the connection is of normal magnitude.

To retrigger the heavy-duty circuit breaker, however, only a very small current is then needed at the gate of the control FCThs as has already been explained in EP-A No. 0 246 478. This is why not only FCThs and GTOs but also commercially available as thyristors (for example of the GA 300 type by the firm Unitrode) can be used in the sub units AS1, . . . , ASn.

Tests have shown that these components also perform the desired mutual triggering and can be turned off by a negative gate voltage against a sufficiently high anode current so that the heavy-duty circuit breaker can be subsequently turned on again. Thus, a particularly inexpensive construction is achieved because such elements can be easily produced on EPI silicon.

Commercially available multi-layer ceramic capacitors in chip form are preferably used as capacitors C1, . . . , Cn in the sub units AS1, . . . , ASn. Special tests have shown that such capacitors by the firm of Siemens (type B37985-N5105-M) can withstand more than 100 A discharge current at a repetition rate of 2 kHz and thus more than 5 times the value required in the application.

In this connection, their inherent inductance is extremely low and the required small circuit inductances can be easily achieved in the proposed arrangement by connecting corresponding chips (type B37957-K5105-M62) in parallel.

Naturally, these chip capacitors can be supported by electrolytic capacitors if a sufficiently large total capacitance for being able to turn off reliably even extra high voltage FCThs or GTOs cannot be achieved by them by simple means.

Naturally, all these components should be accommodated inside the main case of the heavy-duty circuit breaker since otherwise feed-throughs and feed lines necessary partially cancel out the inductance advantage. Only the supporting electrolytic capacitors mentioned can be arranged outside the case since their circuit inductance becomes effective only to a greatly reduced extent because of the parallel-connected ceramic capacitors.

Thus, the temperature limits required for the operation of the heavy-duty circuit breaker can also be guaranteed since certain ceramic chips can be operated even up to 125° C. However, since they are directly connected to the cooling surfaces of the overall case (for example in the embodiment according to FIG. 5), their operating temperature will not reach such high values in any case because of their low power dissipation.

In the embodiment according to FIG. 5, the cathode-side contact to the semiconductor substrate 6 is established by a gate ring 9 and a cathode plate 8.

The cathode plate 8 comprises a cylindrical central part 8a which directly presses on the semiconductor substrate 6, an extension 8b which joins the central part 8a and extends radially outward, and an outer ring 8c which adjoins the extension 8b.

The cylindrical central part 8a is concentrically surrounded by the gate ring 9, which is configured to be insulated by a gate insulation 10, and, with the larger outer ring 8c, forms an annular groove in which the capacitors Cm, n and semiconductor switches (control transistors Tm, n or control thyristors Thm, n) of the sub units are accommodated.

The direct connection of these elements to the outer ring 8c or gate ring 9 results in connections which have a very low inductance. Due to the annular distribution of the sub units, the control of the heavy-duty component is effectively homogenized.

All sub units are in each case connected to common lines which lead to a control input 5 or to a source for the control voltage $V_S$.

Figure 6:
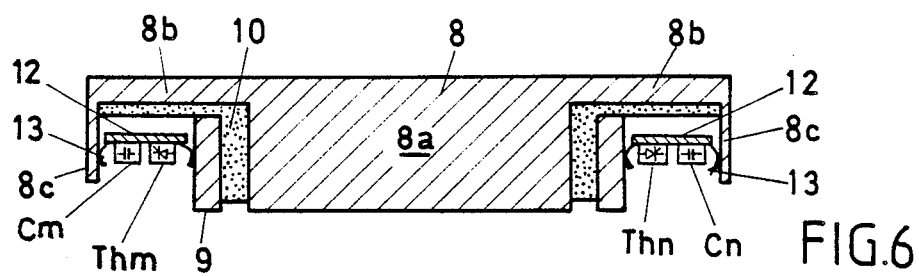
FIG. 6 shows a section of the cathode-side design of a heavy-duty circuit breaker according to a further embodiment of the invention.

Furthermore, to further simplify the configuration, a SMD (Surface Mounted Device) design is proposed (FIG. 6) in which the elements of the sub units are constructed as SMD elements which are accommodated in the annular groove and are connected to the outer ring 8c or gate ring 9 via suitable contact springs 13.

In this manner, the connections and components of the control unit can be produced by conventional means of SMD technology separately of the installation in the cathode-side control head and can be mounted by simple insertion.

Naturally, many other embodiments are conceivable within the framework of the invention. In particular, the heavy-duty circuit breaker can also exhibit any other (for example rectangular) shapes instead of the rotationally symmetric shape described here.

Overall, the invention can be used for considerably extending the power range of heavy-duty circuit breakers due to the improved control arrangement.

What is claimed as new and desired to be secured by Letters Patent of the United States is:

1. Heavy-duty circuit breaker comprising:
   (a) a semiconductor component which can be turned off via a gate, and
   (b) a control unit (AS) which generates the gate current necessary for turn off:
   wherein
   (c) the control unit (AS) is divided into a plurality of sub units (AS1, . . . , ASn) operating in parallel, which in each case generate a part of the gate current necessary for the turn off;
   wherein
   (d) the turn-off-type semiconductor component exhibits a gate electrode (14) which is arranged to be spatially distributed; and
   (e) the sub units are connected at various places of the spatially distributed gate electrode (14).

2. Heavy-duty circuit breaker as claimed in claim 1, wherein the turn-off-type semiconductor component is a gate turn-off thyristor (1) of the type of a GTO, FCTh or SITh, and exhibits an anode (A), a cathode (K) and a gate (G).

3. Heavy-duty circuit breaker as claimed in claim 2, wherein,
   (a) each of the sub units (AS1, . . . , ASn) contains a capacitor (C1, . . . , Cn) and a semiconductor switch;
   (b) in each sub unit (AS1, . . . , ASn) the capacitor (C1, . . . , Cn) is connected with one side to the cathode (K) of the gate turn-off thyristor (1) and with its other side to a common control voltage ($V_S$) and via the switching path of the semiconductor switch to the gate electrode (14) of the gate turn-off thyristor (1); and (c) the control electrode of the semiconductor switches are combined in a common control input (5).

4. Heavy-duty circuit breaker as claimed in claim 3, wherein the capacitors (C1, . . . , Cn) in the sub units (AS1, . . . , ASn) are constructed as multi-layer ceramic capacitors.

5. Heavy-duty circuit breaker as claimed in claim 4, wherein
   (a) the gate turn-off thyristor (1) comprises a large area semiconductor substrate (6);
   (b) the semiconductor substrate (6) is arranged between an anode plate (7) and a cathode plate (8);
   (c) the cathode plate (8) comprises a cylindrical central part (8a), an extension (8b) which adjoins the central part (8a) and extends radially outward, and an outer ring (8c) which adjoins the extension;

(d) the cylindrical central part (8a) of the cathode plate (8) is surrounded by a gate ring (9) of insulated configuration which is arranged concentrically with respect to the outer ring (8c), contacts the gate electrode of the gate turn-off thyristor (1) and forms an annular groove with the larger outer ring (8c); and (e) the sub units (AS1, ..., ASn) with their elements are arranged distributed over the circumference of the circle in the annular groove and are directly connected to the two rings (8c, 9).

6. Heavy-duty circuit breaker as claimed in claim 5, wherein (a) the elements of the sub units are constructed as SMD (Surface Mounted Devices) elements;

(b) the elements are arranged on an annular assembly plate (12); and (c) the assembly plate (12) is accommodated in the annular groove and is connected to the rings (8c, 9) via contact springs (13).

7. Heavy-duty circuit breaker as claimed in any one of claims 3 to 6, wherein the semiconductor switches are constructed as control transistors (T1, ..., Tn) in the form of MOSFETs.

8. Heavy-duty circuit breaker as claimed in any one of claims 3 to 6, wherein the semiconductor switches are constructed as control thyristors in the form of FCThs.

* * * * *

UNITED STATES PATENT AND TRADEMARK OFFICE
CERTIFICATE OF CORRECTION

PATENT NO.  : 4,929,856
DATED       : MAY 29, 1990
INVENTOR(S) : HORST GRÜNING

It is certified that error appears in the above-identified patent and that said Letters Patent is hereby corrected as shown below:

On the title page:

In the inventors, delete "Guning" and insert --Grüning--.

Signed and Sealed this

Twenty-seventh Day of August, 1991

*Attest:*

HARRY F. MANBECK, JR.

*Attesting Officer*  *Commissioner of Patents and Trademarks*